United States Patent
Kim et al.

(10) Patent No.: US 9,274,423 B2
(45) Date of Patent: Mar. 1, 2016

(54) FLUORINE-BASED RESINS AND PHOTOSENSITIVE RESIN COMPOSITION COMPRISING THE SAME

(75) Inventors: Minjung Kim, Daejeon (KR); Han Soo Kim, Daejeon (KR); Kyung Soo Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/237,139

(22) PCT Filed: May 31, 2012

(86) PCT No.: PCT/KR2012/004308
§ 371 (c)(1),
(2), (4) Date: Feb. 4, 2014

(87) PCT Pub. No.: WO2013/018988
PCT Pub. Date: Feb. 7, 2013

(65) Prior Publication Data
US 2014/0212812 A1    Jul. 31, 2014

(30) Foreign Application Priority Data
Aug. 4, 2011 (KR) .................. 10-2011-0077767

(51) Int. Cl.
| | | |
|---|---|---|
| *C08F 18/20* | (2006.01) | |
| *G03F 7/027* | (2006.01) | |
| *G03F 7/20* | (2006.01) | |
| *G03F 7/038* | (2006.01) | |
| *C08F 14/18* | (2006.01) | |
| *C09D 4/06* | (2006.01) | |
| *C08F 220/18* | (2006.01) | |
| *G03F 7/004* | (2006.01) | |
| *G03F 7/033* | (2006.01) | |
| *C08F 214/18* | (2006.01) | |
| *C08F 222/10* | (2006.01) | |
| *C09D 4/00* | (2006.01) | |
| *G03F 7/00* | (2006.01) | |

(52) U.S. Cl.
CPC .............. *G03F 7/0388* (2013.01); *C08F 14/18* (2013.01); *C08F 214/18* (2013.01); *C08F 214/182* (2013.01); *C08F 220/18* (2013.01); *C09D 4/06* (2013.01); *G03F 7/0046* (2013.01); *G03F 7/033* (2013.01); *C08F 222/1006* (2013.01); *C09D 4/00* (2013.01); *G03F 7/0007* (2013.01)

(58) Field of Classification Search
CPC ...... C08F 220/22; C08F 220/24; G03F 7/027; G03F 7/028; G03F 7/033; G03F 7/20
USPC .............. 526/245; 430/281.1, 322, 907, 910
See application file for complete search history.

(56) References Cited

U.S. PATENT DOCUMENTS

| | | | | |
|---|---|---|---|---|
| 4,792,511 | A * | 12/1988 | Kato et al. | 430/87 |
| 5,426,133 | A * | 6/1995 | Hishida et al. | 523/108 |
| 2003/0105236 | A1 | 6/2003 | Hobisch et al. | |
| 2007/0254235 | A1 * | 11/2007 | Allen et al. | 430/270.1 |
| 2008/0145783 | A1 | 6/2008 | Cho et al. | |
| 2010/0081089 | A1 * | 4/2010 | Kim et al. | 430/286.1 |
| 2010/0085518 | A1 * | 4/2010 | Choi et al. | 349/110 |
| 2010/0160477 | A1 | 6/2010 | Cho et al. | |
| 2012/0148957 | A1 | 6/2012 | Enomoto et al. | |

FOREIGN PATENT DOCUMENTS

| | | |
|---|---|---|
| CN | 101652713 A | 2/2010 |
| CN | 101762980 A | 6/2010 |
| JP | 2002-091001 A | 3/2002 |
| JP | 2007-016082 A | 1/2007 |
| JP | 2009-270086 A | 11/2009 |
| JP | 2011100089 A | 5/2011 |
| KR | 10-2005-0094163 A | 9/2005 |
| KR | 10-2009-0058204 A | 6/2009 |
| KR | 10-209-0081208 A | 7/2009 |
| KR | 102010-0042173 A | 4/2010 |
| KR | 10-20100067833 A | 6/2010 |
| WO | WO 2008/127036 | * 10/2008 |

OTHER PUBLICATIONS

Office Action issued in Korean Patent Application No. 10-2012-0058468 along with partial English translation, 11 pages.
First Office Action issued in Chinese Patent Application No. 2012800375872 on Mar. 2, 2015 along with English translation, 15 pages.
Notification of Reasons for Refusal in Japanese Patent Application No. 2014-522728 on Jan. 20, 2015 along with English translation, 7 pages.
Second Office Action issued in Chinese Patent Application No. 201280037587.2 on Aug. 20, 2015 along with English translation, 21 pages.
Cheng Shiyuan et al. "Polymer Materials Science and Engineering", China Academic Journal Electronic Publishing House, vol. 19, No. 3, May 2003, pp. 49-53.

* cited by examiner

*Primary Examiner* — Anca Eoff
(74) *Attorney, Agent, or Firm* — Rothwell, Figg, Ernst & Manbeck, P.C.

(57) ABSTRACT

The present application relates to a fluorine-based resin having a novel structure and a photosensitive resin composition including the same. The photosensitive resin composition including the fluorine-based resin according to an exemplary embodiment of the present application has excellent photosensitivity and developability and can increase a contact angle of a coating film to prevent a water stain. Accordingly, the photosensitive resin composition including the fluorine-based resin according to the exemplary embodiment of the present application may be applied to various photosensitive materials, and particularly, may be preferably applied when a color filter pattern for LCD is manufactured.

16 Claims, No Drawings

FLUORINE-BASED RESINS AND PHOTOSENSITIVE RESIN COMPOSITION COMPRISING THE SAME

CROSS REFERENCE TO RELATED APPLICATIONS

This application is a 35 U.S.C. §371 National Phase Entry Application from PCT/KR2012/004308, filed May 31, 2012, and designating the United States, which claims priority under 35 U.S.C. §119 to Korean Patent Application No. 10-2011-0077767 filed Aug. 4, 2011, which is incorporated herein in its entirety.

TECHNICAL FIELD

This application claims priority from Korean Patent Application No. 10-2011-0077767 filed on Aug. 4, 2011, in the KIPO, the disclosure of which is incorporated herein by reference in its entirety.

The present application relates to a fluorine-based resin having a novel structure, a photosensitive resin composition including the same, a photosensitive material manufactured by using the same, and an electronic device manufactured by using the same.

BACKGROUND ART

A photosensitive resin composition may be applied on a substrate to form a paint film and used to form a pattern by subjecting a specific portion of the paint film to exposure by light irradiation using a photomask and the like and then subjecting a non-exposure portion to a development treatment to remove the non-exposure portion. This photosensitive resin composition has been used for a photocurable ink, a photosensitive printing plate, various photoresists, a color filter photoresist for a LCD, a photoresist for a resin black matrix, a transparent photosensitive material or the like since the photosensitive resin composition may be polymerized and cured by light irradiation.

The photosensitive resin composition usually includes an alkali soluble resin, a polymerizable compound including an ethylenically unsaturated bond, a photopolymerization initiator and a solvent.

In the photosensitive resin composition, an alkali soluble resin allows the photosensitive resin composition to have adhesive strength with a substrate and thus a coating may be formed, is dissolved in an alkali liquid developer to allow a fine pattern to be formed, and simultaneously serves to prevent an obtained pattern from being broken during a post-treatment process by imparting strength to the pattern. Further, the alkali soluble resin has great effects even on heat resistance and chemical resistance.

In general, the photosensitive resin composition is formed as a coating film having a thickness of 3 μm or more and most of the coating film needs to be developed, and thus the photosensitive resin composition needs to be dissolved in a large amount in a liquid developer within a short time period. In addition, when development is not clearly performed, various display defects such as direct spots due to residues and alignment defects of liquid crystals may occur. Therefore, the photosensitive resin composition needs to have excellent developability. Moreover, when a photosensitive resin composition is applied on a glass substrate with a large surface area, it is difficult for the substrate to be subjected to full-surface exposure, and thus the substrate is subjected to exposure in multiple sequences. Thus, when the photosensitive resin composition has low sensitivity, the time needed for the exposure process becomes longer, resulting in a drop in productivity, and thus high sensitivity is required.

Moreover, even in a high temperature process at 200° C. or higher, excellent thermal stability for maintaining the shape and thickness, high compress strength sufficient to resist against external pressure and excellent chemical resistance are required. In addition, excellent stability with time may stably exhibit characteristics which are constantly required without any changes even under long-term storage conditions, and thus excellent stability with time is required. However, a photosensitive resin composition that meets all the standards in terms of heat resistance, chemical resistance, developability, sensitivity and stability with time has not been yet developed.

Furthermore, in a process of using the above-described photosensitive resin composition, in order to improve a yield per unit time of the process, exposure time and development time are reduced. Thus, there is a need for improving sensitivity and developability, compared to photosensitive resin compositions that are known in the art.

A method of using a photoactive compounds with high sensitivity or increasing the amount of the photoactive compound has been used to increase sensitivity of a photosensitive resin composition. However, the photoactive compounds with high sensitivity has a relatively expensive problem. In addition, when the amount of the photoactive compound is increased, a lot of sublimate foreign bodies occurred in the process of post baking may contaminate the oven or contaminate the components such as liquid crystal in the LCD panel.

Recently, a method of photocrosslinking an alkali-soluble resin and an ethylenically unsaturated compound has been made in an effort to introduce a photopolymerizable functional group to a side chain of an alkali-soluble resin used in a photosensitive resin composition.

However, even though photosensitivity and a ratio of the photopolymerizable reactive group introduced into the alkali-soluble resin are in a positive relationship, since the photopolymerizable reactive group is introduced into an acid group portion of the alkali-soluble resin, if the ratio of the photopolymerizable reactive group in the alkali-soluble resin is increased, the ratio of the remaining acid group is relatively reduced to reduce developability.

Meanwhile, a contact angle of a known photosensitive resin composition is controlled by a kind and an amount of surfactant. However, there are many cases where the contact angle is not controlled by the surfactant due to a limitation of raw material of the photosensitive resin composition. This is because the surfactant is partially removed during a manufacturing process of a color filter.

Accordingly, there is a demand for developing the photosensitive resin composition increasing the contact angle while the surfactant is not removed during the manufacturing process of the color filter in the art.

DISCLOSURE

Technical Problem

An object of the present application is to provide a photosensitive resin composition that has excellent photosensitivity and developability and can solve a problem of a water stain due to a high contact angle thereof, a photosensitive material manufactured by using the same, and an electronic device manufactured by using the same.

Technical Solution

An exemplary embodiment of the present application provides a fluorine-based resin comprising: 1) a repeating unit represented by the following Formula 1, 2) a repeating unit represented by the following Formula 2, 3) a repeating unit represented by the following Formula 3, and 4) one or more kinds of repeating units represented by the following Formula 4, Formula 5 and Formula 6.

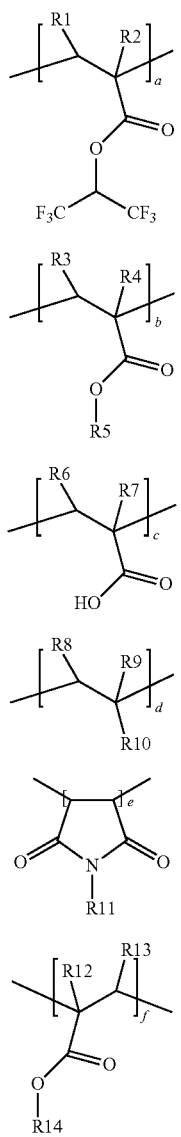

[Formula 1]

[Formula 2]

[Formula 3]

[Formula 4]

[Formula 5]

[Formula 6]

In Formula 1 to Formula 6,

R1, R2, R3, R4, R6, R7, R8, R9, R12 and R13 are the same as or different from each other, and each independently hydrogen or a $C_1$-$C_5$ alkyl group, R5 is a $C_1$-$C_{18}$ alkyl group, R10 is a phenyl group, a phenyl group substituted by halogen, or a phenyl group substituted by a $C_1$-$C_3$ alkyl group, R11 is a phenyl group, a phenyl group substituted by halogen, or a phenyl group substituted by a $C_1$-$C_3$ alkyl group, R14 is a $C_1$-$C_6$ alkyl group substituted by a phenyl group, a phenyl group substituted by a $C_1$-$C_6$ alkyl group, a phenyl group substituted by a $C_1$-$C_6$ alkoxy group, or a $C_1$-$C_6$ alkoxymethyl group, and a, b, c, d, e and f are a mole mixing ratio, a is 5 to 30, b is 5 to 30, c is 10 to 60, d is 0 to 20, e is 0 to 20, and f is 0 to 70.

Another exemplary embodiment of the present application provides a photosensitive resin composition comprising: a binder resin including the fluorine-based resin, a polymerizable compound including an ethylenically unsaturated bond, a photoactive compound, and a solvent.

Yet another exemplary embodiment of the present application provides a photosensitive material manufactured by using the photosensitive resin composition.

Still another exemplary embodiment of the present application provides a method of manufacturing a photosensitive material, comprising: applying the photosensitive resin composition on a substrate; and exposing and developing the applied photosensitive resin composition.

Still yet another exemplary embodiment of the present application provides an electronic device manufactured by using the photosensitive resin composition.

Advantageous Effects

A photosensitive resin composition comprising a fluorine-based resin according to an exemplary embodiment of the present application has excellent photosensitivity and developability and can increase a contact angle of a coating film to prevent a water stain. Accordingly, the photosensitive resin composition comprising the fluorine-based resin according to the exemplary embodiment of the present application may be applied to various photosensitive materials, and particularly, may be preferably applied when a color filter pattern for an LCD is manufactured.

MODE FOR APPLICATION

Hereinafter, the present application will be described in more detail.

A fluorine-based resin according to an exemplary embodiment of the present application comprises 1) a repeating unit represented by Formula 1; 2) a repeating unit represented by Formula 2; 3) a repeating unit represented by Formula 3; and 4) one or more kinds of repeating units represented by Formula 4, Formula 5 and Formula 6.

In the fluorine-based resin according to the exemplary embodiment of the present application, substituent groups of Formula 1 to Formula 6 will be described in more detail below.

An alkyl group may be a straight chain or a branched chain, and specific examples thereof include a methyl group, an ethyl group, a propyl group, an isopropyl group, a butyl group, a t-butyl group and the like, but are not limited thereto.

A halogen group may be fluorine, chlorine, bromine or iodine.

The alkoxy group may be a straight chain, a branched chain or a cycle chain, and a substituted or unsubstituted matter. Examples of the alkoxy group may include a methoxy group, an ethoxy group, a n-propyloxy group, an iso-propyloxy group, a n-butyloxy group, a cyclopentyloxy group and the like, but are not limited thereto.

In the present specification,

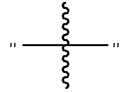

means a connection portion between the repeating units.

a, b, c, d, e and f are a mole mixing ratio, a is 5 to 30, b is 5 to 30, c is 10 to 60, d is 0 to 20, e is 0 to 20, and f is 0 to 70.

The fluorine-based resin according to the exemplary embodiment of the present application may comprise a repeating unit represented by any one of the following Formula 7 to Formula 13.

[Formula 7]
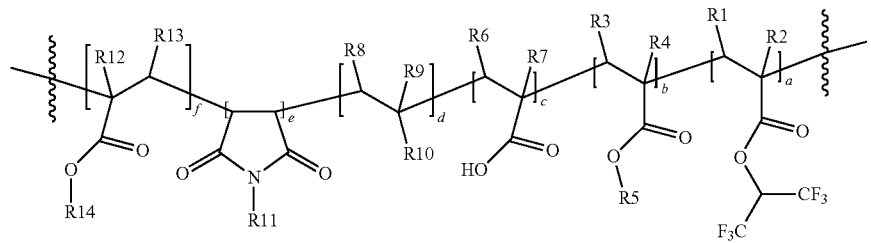
[Formula 8]
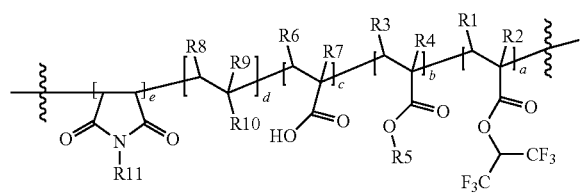
[Formula 9]
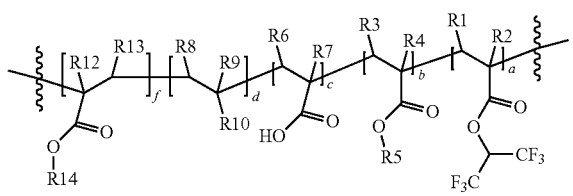
[Formula 10]
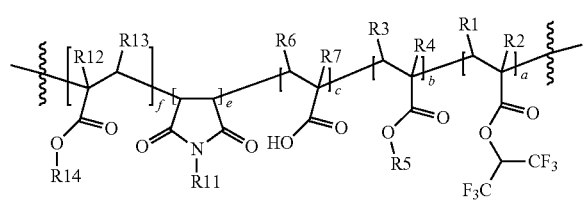
[Formula 11]
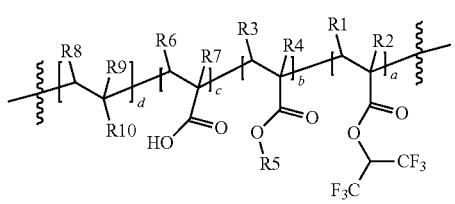
[Formula 12]
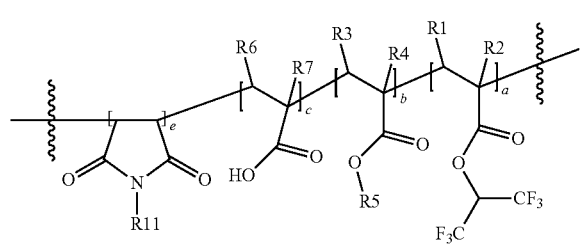
[Formula 13]
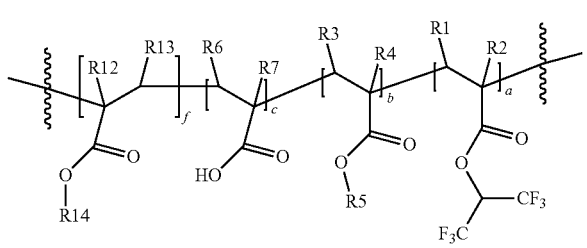

In Formula 7 to Formula 13, R1 to R14, and a to f are the same as definitions of Formula 1 to Formula 6.

The fluorine-based resin according to the exemplary embodiment of the present application may comprise a repeating unit represented by the following Formula 14, but the repeating unit is not limited thereto.

[Formula 14]

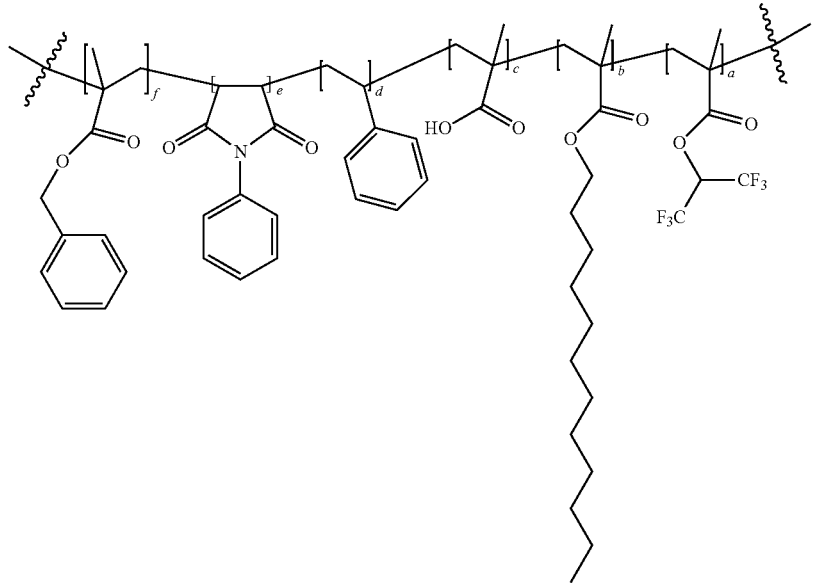

In Formula 14, a to f are the same as definitions of Formula 1 to Formula 6.

An acid value of the fluorine-based resin may be preferably about 30 to 300 KOH mg/g and more preferably about 50 to 150 KOH mg/g. In the case where the acid value is 30 KOH mg/g or more, developing may be well performed to obtain a clean pattern, and in the case where the acid value is 300 KOH mg/g or less, a washing property may be excessively improved to prevent a problem of removal of the pattern.

A weight average molecular weight of the fluorine-based resin is in the range of preferably 5,000 to 30,000 and more preferably 5,000 to 15,000. In the case where the weight average molecular weight of the binder resin is 5,000 or more, heat resistance and chemical resistance are good, and in the case where the weight average molecular weight is 30,000 or less, solubility to the developing solution may be reduced to hinder developing or excessively increase viscosity of the solution, thus preventing a problem of hindering uniform coating.

Further, the photosensitive resin composition according to the exemplary embodiment of the present application comprises a binder resin including the fluorine-based resin, a polymerizable compound including an ethylenically unsaturated bond, a photoactive compound and a solvent.

In the photosensitive resin composition according to the exemplary embodiment of the present application, the content of the binder resin may be 1 to 20 wt % based on the total weight of the photosensitive resin composition, but is not limited thereto. If the content of the binder resin is 1 wt % or more, there is an effect that patterning using the alkali aqueous solution is well performed, and it is possible to prevent a problem that it is difficult to form the pattern because solubility to the developing solution is not well exhibited, and if the content of the binder resin is 20 wt % or less, there are effects that it is possible to prevent removal of the pattern during the developing process and prevent occurrence of a problem that it is difficult to perform coating due to excessively high viscosity of the entire solution.

The photosensitive resin composition according to the exemplary embodiment of the present application may include a crosslinking compound, and specifically, a crosslinking compound including an ethylenically unsaturated group may be used. To be more specific, a crosslinking compound including two or more unsaturated acryl groups or a crosslinking compound including three or more unsaturated acryl groups may be used. Specific examples thereof include a compound obtained by esterifying polyhydric alcohols of ethyleneglycol di(metha)acrylate, polyethyleneglycol di(metha)acrylate having the number of ethylene groups of 2 to 14, trimethylolpropane di(metha)acrylate, trimethylolpropane tri(metha)acrylate, pentaerythritol tri(metha)acrylate, pentaerythritol tetra(metha)acrylate, 2-trisacryloyloxymethylethyl phthalate, propyleneglycol di(metha)acrylate having the number of propylene groups of 2 to 14, dipentaerythritol penta(metha)acrylate, dipentaerythritol hexa(metha)acrylate and a mixture of acidic modified matter of dipentaerythritol penta(metha)acrylate and dipentaerythritol hexa(metha)acrylate by α,β-unsaturated carboxylic acid; a compound obtained by adding (metha)acrylic acid to a compound including a glycidyl group such as a trimethylolpropane triglycidylether acrylate addition material and a bisphenol A diglycidylether acrylate addition material; ester compounds of the compound having a hydroxy group or an ethylenically unsaturated bond and polyvalent carboxylic acid, such as diester phthalates of β-hydroxyethyl(metha)acrylate and toluene diisocyanate addition materials of β-hydroxyethyl (metha)acrylate, or addition materials with polyisocyanate, where examples of the compound having the ethylenically unsaturated bond include one or more kinds selected from the group consisting of allyl glycidyl ether, glycidyl(metha)acrylate, 3,4-epoxycyclohexylmethyl(metha)acrylate, glycidyl 5-norbornene-2-methyl-2-carboxylate (endo and exo mixtures), 1,2-epoxy-5-hexene, and 1,2-epoxy-9-decene; alkylester(metha)acrylate selected from the group consisting of methyl(metha)acrylate, ethyl(metha)acrylate, butyl(metha) acrylate and 2-ethylhexyl(metha)acrylate, but are not limited thereto and compounds that are known in the art may be used.

The content of the polymerizable compound including the ethylenically unsaturated bond is preferably 1 to 30 wt % based on the total weight of the photosensitive resin composition, but is not limited thereto. If the content is wt % or more, preferably, a crosslinking reaction is performed by light, and photosensitivity or strength of a coating film is not reduced, and if the content is 30 wt % or less, solubility to alkali may be reduced to prevent a problem of hindering pattern formation and a problem that an adhesive property of a photosensitive resin layer becomes excessive to make strength of the film insufficient.

In the photosensitive resin composition according to the exemplary embodiment of the present application, the photoactive compound is a material generating radicals by light to trigger cross-linking and specifically, a photoactive compound may be selected from the group consisting of a triazine-based compound, a biimidazole-based compound, an acetophenone-based compound, an O-acyloxime-based compound, a benzophenone-based compound, a thioxantone-based compound, a phosphine oxide-based compound and a coumarine-based compound. More specific examples of the photoactive compound include a triazine-based compound selected from the group consisting of 2,4-trichloromethyl-(4'-methoxyphenyl)-6-triazine, 2,4-trichloromethyl-(4'-methoxystyryl)-6-triazine, 2,4-trichloromethyl-(perfluonyl)-6-triazine, 2,4-trichloromethyl-(3',4'-dimethoxyphenyl)-6-triazine, 3-{4-[2,4-bis(trichloromethyl)-s-triazine-6-yl]phenylthio}propanic acid, 2,4-trichloromethyl-(4'-ethylbiphenyl)-6-triazine and 2,4-trichloromethyl-(4'-methylbiphenyl)-6-triazine; a biimidazole compound selected from the group consisting of 2,2'-bis(2-chlorophenyl)-4,4',5,5'-tetraphenyl biimidazole and 2,2'-bis(2,3-dichlorophenyl)-4,4',5,5'-tetraphenylbiimidazole; an acetophenone-based compound selected from the group consisting of 2-hydroxy-2-methyl-1-phenylpropane-1-on, 1-(4-isopropylphenyl)-2-hydroxy-2-methylpropane-1-on, 4-(2-hydroxyethoxy)-phenyl(2-hydroxy)propyl ketone, 1-hydroxycyclohexyl phenyl ketone, 2,2-dimethoxy-2-phenylacetophenone, 2-methyl-(4-methylthiophenyl)-2-morpholino-1-propane-1-on (Irgacure-907) and 2-benzyl-2-dimethylamino-1-(4-morpholinophenyl)-butane-1-on (Irgacure-369); an O-acyloxime-based compound such as Irgacure OXE 01 and Irgacure OXE 02 manufactured by BASF Co., Ltd. and N-1919, NCI-831 and NCI-930 manufactured by ADEKA Co., Ltd.; a benzophenone-based compound such as 4,4'-bis(dimethylamino)benzophenone and 4,4'-bis(diethylamino)benzophenone; a thioxantone-based compound selected from the group consisting of 2,4-diethyl thioxantone, 2-chloro thioxantone, isopropyl thioxantone and diisopropyl thioxantone; a phosphine oxide-based compound selected from the group consisting of 2,4,6-trimethylbenzoyl diphenylphosphine oxide, bis(2,6-dimethoxybenzoyl)-2,4,4-trimethylpentyl phosphine oxide and bis(2,6-dichlorobenzoyl) propyl phosphine oxide; a coumarine-based compound selected from the group consisting of 3,3'-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine and 10,10'-carbonylbis[1,1,7,7-tetramethyl-2,3,6,7-tetrahydro-1H,5H,11H-Cl]-benzopyrano[6,7,8-ij]-quinolizine-11-on.

The content of the photoactive compound is preferably 0.1 to 5 wt % based on the total weight of the photosensitive resin composition, but is not limited thereto. If the content is 0.1 wt % or more, sufficient sensitivity may be provided, and if the content is 5 wt % or less, a problem that UV rays do not reach to the bottom due to excessively high UV absorption may be prevented.

In the photosensitive resin composition according to the exemplary embodiment of the present application, preferable examples of the solvent include one or more kinds selected from the group consisting of acetone, methyl ethyl ketone, methyl isobutyl ketone, methylcellosolve, ethylcellosolve, tetrahydrofuran, 1,4-dioxane, ethyleneglycol dimethyl ether, ethyleneglycol diethyl ether, propyleneglycol dimethyl ether, propyleneglycol diethylether, diethyleneglycol dimethylether, diethyleneglycol diethylether, diethyleneglycol methyl ethyl ether, chloroform, methylene chloride, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butanol, t-butanol, 2-ethoxy propanol, 2-methoxy propanol, 3-methoxy butanol, cyclohexanone, cyclopentanone, propyleneglycol methyl ether acetate, propelenglycol ethyl ether acetate, 3-methoxybutyl acetate, ethyl 3-ethoxy propionate, ethyl cellosolveacetate, methyl cellosolveacetate, and butyl acetate, dipropyleneglycol monomethyl ether and the like, but are not limited thereto, and a solvent known in the art may be used.

The content of the solvent is preferably 40 to 95 wt % based on the total weight of the photosensitive resin composition, but is not limited thereto.

The photosensitive resin composition according to the exemplary embodiment of the present application may further include a surfactant in addition to the aforementioned constituent components, if necessary.

Examples of the surfactant may include R08MH, MCF 350SF, F-475, F-488, F-552 (hereinafter, DIC Co., Ltd.) and the like, but are not limited thereto.

The surfactant may be included in the content of 0.01 to 5 wt %.

The photosensitive resin composition according to the exemplary embodiment of the present application is a transparent photosensitive resin composition, and may include 1 to 20 wt % of the binder resin including the fluorine-based resin, 1 to 30 wt % of the polymerizable compound including an ethylenically unsaturated bond, 0.1 to 5 wt % of the photoactive compound, 0.01 to 5 wt % of the surfactant and 40 to 95 wt % of the solvent.

The photosensitive resin composition according to the exemplary embodiment of the present application may further include a colorant.

In the photosensitive resin composition according to the exemplary embodiment of the present application, one or more kinds of pigments or dyes or mixtures thereof may be used as the colorant. Specifically, metal oxides such as carbon black, graphite, and titanium black may be used as a black pigment. Examples of the carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon Co., Ltd.); Diagram black II, Diagram black N339, Diagram black SE, Diagram black E, Diagram LH, Diagram EA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B (Mitsubishi Chemical Co., Ltd.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890F, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Columbia Carbon Co., Ltd.), mixtures thereof or the like. Further, examples of the colorant exhibiting a color include carmine 6B (C.I. 12490), phthalocyanine green (C.I. 74260), phthalocyanine blue (C.I. 74160), perylene black (BASF K0084. K0086), cyanine black, linol yellow (C.I. 21090), linol yellow GRO (C.I. 21090), benzidine yellow 4T-564D, victoria pure blue (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, and 272; C.I. PIGMENT GREEN 7, 36, 58; C.I. PIGMENT blue 15:1, 15:3, 15:4, 15:6, 16, 22, 28, 36, 60, and 64; C.I. PIGMENT yellow 13, 14, 35, 53, 83, 93, 95, 110, 120, 138, 139, 150, 151, 154, 175, 180, 181, 185, 194, and 213; C.I. PIGMENT VIOLET 15, 19, 23, 29, 32, 37 and the like, and in addition to this, a white pigment, a fluorescent pigment or the like may be used. A material in which zinc is used as the central metal other than copper may be used as the phthalocyanine-based complex compound used as the pigment.

In the photosensitive resin composition according to the exemplary embodiment of the present application, the content of the colorant may be 1 to 20 wt % based on the total weight of the photosensitive resin composition, but is not limited thereto.

The photosensitive resin composition according to the exemplary embodiment of the present application is a colored photosensitive resin composition, and may include 1 to 20 wt % of the binder resin including the fluorine-based resin, 1 to 30 wt % of the polymerizable compound including an ethylenically unsaturated bond, 1 to 20 wt % of a colorant, 0.1 to 5 wt % of the photoactive compound, 0.01 to 5 wt % of the surfactant and 40 to 95 wt % of the solvent.

The photosensitive resin composition according to the exemplary embodiment of the present application may further include one or two or more additives such as a curing accelerator, a thermal polymerization inhibitor, a dispersing agent, an antioxidant, a UV absorbent, a leveling agent, a photosensitizer, a plasticizer, an adhesion promoter, a filler or a surfactant in addition to the aforementioned constituent components, if necessary.

Examples of the curing accelerator may include one or more kinds selected from the group consisting of 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyrydine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate), but are not limited thereto, and may include matters that are known in the art.

Examples of the thermal polymerization inhibitor may include one or more kinds selected from the group consisting of p-anisole, hydroquinone, pyrocatechol, t-butyl catechol, N-nitrosophenylhydroxyamine ammonium salts, N-nitrosophenylhydroxyamine aluminum salts and phenothiazine, but are not limited thereto, and may include matters that are known in the art.

In the photosensitive resin composition according to the exemplary embodiment of the present application, a polymer type, nonionic, anionic or cationic dispersing agent may be used as the dispersing agent. Non-limiting examples of the dispersing agent may include polyalkyleneglycol and esters thereof, polyoxyalkylene polyhydric alcohols, esteralkylene oxide additions, alcoholalkylene oxide additions, ester sulfonate, sulfonates, ester carboxylates, carboxylates, alkylamide alkylene oxide additions, alkylamine and the like, one kind or a mixture of two or more kinds selected from the examples may be used, but the examples are not limited thereto.

Non-limiting examples of the antioxidant may include one or more kinds selected from 2,2-thiobis(4-methyl-6-t-butylphenol) and 2,6-g,t-butylphenol, but are not limited thereto.

Non-limiting examples of the UV absorbent may include one or more kinds selected from 2-(3-t-butyl-5-methyl-2-hydroxyphenyl)-5-chloro-benzotriazol and alkoxy benzophenone, but are not limited thereto.

Non-limiting examples of the adhesion promoter may include one or more kinds selected from vinyltrimethoxysilane, vinyltriethoxysilane, vinyl tris(2-methoxyetoxy)-silane, n-(2-aminoethyl)-3-aminopropyltrimethoxysilane, n-(2-aminoethyl)-3-aminopropyl methyl trimethoxysilane, 3-aminopropyltriethoxysilane, 3-glycidoxypropyltriethoxysilane, 3-glycidoxypropyl methyldiethoxysilane, 2-(3,4-epoxycyclohexyl)ethyltrimethoxysilane-, 3-chloropropyl methyl dimethoxysilane, 3-chloropropyl trimethoxysilane, 3-methacryloxypropyltrimethoxysilane and 3-mercaptopropyltrimethoxysilane.

All compounds that can be included in a known photosensitive resin composition may be used as the leveling agent, the photosensitizer, the plasticizer, the filler and the like.

In the case where other components are added to the photosensitive resin composition of the present application, it is preferable that the additives be each included in the content of 0.01 to 5 wt %.

The photosensitive resin composition according to the exemplary embodiment of the present application is used in a roll coater, a curtain coater, a spin coater, a slot die coater, and various printings, dipping and the like, and may be applied on a support of metal, paper, glass, and plastic substrates.

In addition, the composition may be transferred on the other support after being applied on the support such as a film, or may be transferred on a blanket after being applied on a first support and transferred on a second support again, but the application method thereof is not particularly limited.

Examples of a light source for curing the photosensitive resin composition of the present application include a mercury vapor arc, a carbon arc, and a Xe arc emitting light having a wavelength of 250 to 450 nm.

The photosensitive resin composition including the fluorine-based resin according to the exemplary embodiment of the present application has excellent photosensitivity and developability and can increase a contact angle of a coating film to prevent a water stain. Accordingly, the photosensitive resin composition including the fluorine-based resin according to the exemplary embodiment of the present application may be applied to various photosensitive materials, and particularly, may be preferably applied when a color filter pattern for LCD is manufactured.

In addition, the present application provides a photosensitive material manufactured by using the photosensitive resin composition. The photosensitive material includes the photosensitive resin composition.

The photosensitive resin composition according to the exemplary embodiment of the present application is preferably used in a pigment dispersion type photosensitive material for manufacturing a color filter, for example, a pigment dispersion type photosensitive material for manufacturing a TFT LCD color filter, a photosensitive material for forming a black matrix, for example, a photosensitive material for forming a black matrix of a TFT LCD or organic light emitting diode, a photosensitive material for forming an overcoat layer, and a photosensitive material for a column spacer, and may be used in manufacturing a photosensitive material for a photocurable paint, photocurable ink, photocurable adhesive, a printed board, and a printed circuit board, and other transparent photosensitive materials and PDPs, and the purpose thereof is not particularly limited.

The exemplary embodiment of the present application provides a method of manufacturing a photosensitive material, comprising: applying the photosensitive resin composition on a substrate; and exposing and developing the applied photosensitive resin composition.

In the method for manufacturing the photosensitive material according to the exemplary embodiment of the present application, the applying of the photosensitive resin composition on the substrate may be performed on the substrate by using, for example, a method that is known in the art. To be more specific, examples of the method for applying the photosensitive resin composition may include a spray method, a roll coating method, a spin coating method, a bar coating method, a slit coating method and the like, but are not limited thereto.

In this case, the substrate may use metal, paper, glass, plastic, silicon, polycarbonate, polyester, aromatic polyamide, polyamideimide, polyimide and the like, and these substrates may be subjected to appropriate pretreatment such as chemical treatment by a silane coupling agent, plasma treatment, ion plating, sputtering, a vapor reaction method and vacuum deposition according to the purpose thereof. In addition, a thin film transistor for driving may be selectively mounted on the substrate, and a nitrated silicon film may be sputtered.

In the method of manufacturing the photosensitive material according to the exemplary embodiment of the present application, referring to the more specific description of the exposing and developing of the applied photosensitive resin composition, UV may be radiated on the prebaked coat film through a predetermined pattern mask and an unnecessary portion may be removed by developing using an alkali aqueous solution to form the pattern. In this case, a dipping method, a shower method and the like may be used as the developing method without a limitation. A developing time is generally about 30 to 180 sec. Examples of the developing solution may include aqueous alkali solutions of inorganic alkalis such as sodium hydroxide, potassium hydroxide, sodium silicate, sodium methsilicate and ammonia; primary amines such as ethylamine and N-propylamine; secondary amines such as diethylamine and di-n-propylamine; tertiary amines such as trimethylamine, methyldiethylamine and dimethylethylamine; tertiary alcoholamines such as dimethylethanolamine, methyldiethanolamine and triethanolamine; tertiary cycloamines such as pyrrole, piperidine, n-methylpiperidine, n-methylpyrrolidine, 1,8-diazabicyclo[5.4.0]-7-undecene, 1,5-diazabicyclo[4.3.0]-5-nonene; aromatic tertiary amines such as pyridine, coridine, lutidine and quinoline; and quaternary ammonium salts such as tetramethylammonium hydroxide and tetraethylammonium hydroxide as an alkali aqueous solution.

After the developing, water washing may be performed for about 30 to 90 sec, and drying may be performed with air or nitrogen to form the pattern. This pattern may be post-baked by using a heating device such as a hot plate and an oven to obtain a final photosensitive material pattern. In this case, it is preferable that heating be performed at 150 to 250° C. for 10 to 90 min for the post-baking condition.

The exemplary embodiment of the present application provides an electronic device manufactured by using the photosensitive resin composition.

Hereinafter, preferable Synthetic Examples, Examples and Comparative Examples will be described in order to help understand the present application. However, the following Synthetic Examples and Examples are set forth to illustrate the present application, but the scope of the present application is not limited thereto.

SYNTHETIC EXAMPLE 1

Manufacturing of the Compound Including the Repeating Unit of Formula 14

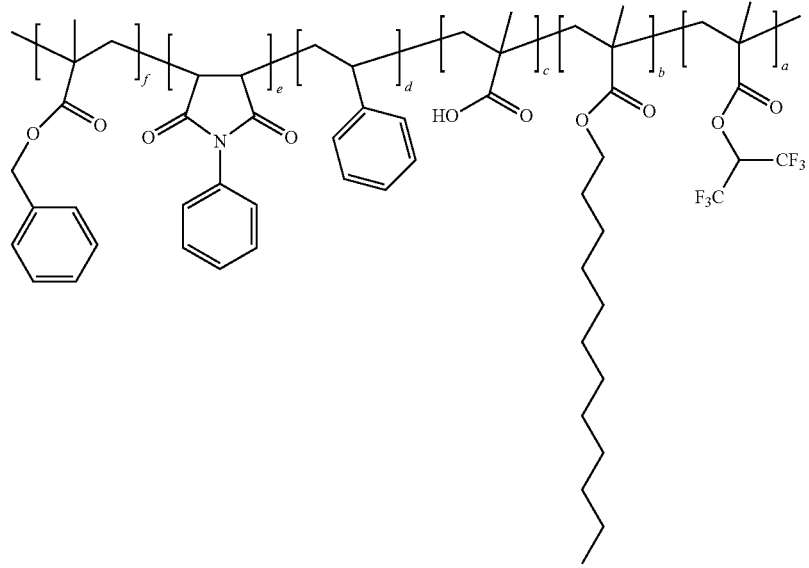

[Formula 14]

13.43 g of methacrylic acid, 50.49 g of benzyl methacrylate, 5.97 g of styrene, 8.27 g of N-phenylmaleimide, 24.30 g of lauryl methacrylate, 22.55 g of hexafluoroisopropyl methacrylate, and 375 g of the propyleneglycol monomethylether acetate solvent were added, 0.63 g of 3-mercapto propionate that was the chain transfer agent was added thereto while agitating was performed under a reflux in a nitrogen atmosphere, and AIBN as the reaction initiator was added thereto to initiate the reaction. The reaction was performed at 70° C. for 9 hours to manufacture the alkali-soluble resin. The polystyrene-reduced weight average molecular weight of the alkali-soluble resin measured by the GPC was 17,600 g/mol, the acid value was 75 mg KOH/g, and the molecular weight distribution (Mw/Mn) was 2.3.

COMPARATIVE SYNTHETIC EXAMPLE 1

13.43 g of methacrylic acid, 63.28 g of benzyl methacrylate, 7.48 g of styrene, 10.36 g of N-phenylmaleimide, 30.45 g of lauryl methacrylate, and 375 g of the propyleneglycol monomethylether acetate solvent were added, 0.63 g of 3-mercapto propionate that was the chain transfer agent was added thereto while agitating was performed under a reflux in a nitrogen atmosphere, and AIBN as the reaction initiator was added thereto to initiate the reaction. The reaction was performed at 70° C. for 9 hours to manufacture the alkali-soluble resin. The polystyrene-reduced weight average molecular weight of the alkali-soluble resin measured by the GPC was 17,000 g/mol, the acid value was 72 mg KOH/g, and the molecular weight distribution (Mw/Mn) was 2.2.

EXAMPLE 1

10 g of the fluorine-based binder resin manufactured in Synthetic Example 1, 17 g of dipentaerythritol hexaacrylate that was the polymerizable compound including the ethylenically unsaturated bond, 0.3 g of KBM-503 that was the adhesion aid, 0.6 g of Irgacure OXE-02 (BASF, Co., Ltd.) as the photoactive compound, 0.06 g of R08MH that was the surfactant, and 72.04 g of PGMEA that was the organic solvent were mixed for 3 hours by using the shaker to obtain the photosensitive resin composition solution.

COMPARATIVE EXAMPLE 1

10 g of the binder resin manufactured in Comparative Synthetic Example 1, 17 g of dipentaerythritol hexaacrylate that was the polymerizable compound including the ethylenically unsaturated bond, 0.3 g of KBM-503 that was the adhesion aid, 0.6 g of Irgacure OXE-02 (BASF, Co., Ltd.) as the photoactive compound, 0.06 g of R08MH that was the surfactant, and 72.04 g of PGMEA that was the organic solvent were mixed for 3 hours by using the shaker to obtain the photosensitive resin composition solution.

COMPARATIVE EXAMPLE 2

10 g of the binder resin manufactured in Comparative Synthetic Example 1, 17 g of dipentaerythritol hexaacrylate that was the polymerizable compound including the ethylenically unsaturated bond, 0.3 g of KBM-503 that was the adhesion aid, 0.6 g of Irgacure OXE-02 (BASF, Co., Ltd.) as the photoactive compound, 5 g of R08MH that was the surfactant, and 76.98 g of PGMEA that was the organic solvent were mixed for 3 hours by using the shaker to obtain the photosensitive resin composition solution.

COMPARATIVE EXAMPLE 3

10 g of the binder resin manufactured in Comparative Synthetic Example 1, 17 g of dipentaerythritol hexaacrylate that was the polymerizable compound including the ethylenically unsaturated bond, 0.3 g of KBM-503 that was the adhesion aid, 0.6 g of Irgacure OXE-02 (BASF, Co., Ltd.) as the photoactive compound, 0.06 g of F-475 that was the surfactant, and 72.04 g of PGMEA that was the organic solvent were mixed for 3 hours by using the shaker to obtain the photosensitive resin composition solution.

EXPERIMENTAL EXAMPLE 1

Measurement of the Contact Angle of Water

The color filter films were manufactured by the photosensitive resin compositions manufactured in Example 1 and Comparative Examples 1 to 3. The contact angle of water in the manufactured color filter film was measured by using DSA 100 equipment. The measurement results are described in the following Table 1.

TABLE 1

|  | Contact angle of water (°) |
| --- | --- |
| Comparative Example 1 | 39 |
| Comparative Example 2 | 42 |
| Comparative Example 3 | 40 |
| Example 1 | 57 |

It could be confirmed that the photosensitive resin composition of Example 1 had the improved contact angle as compared to the known photosensitive resin composition of Comparative Example 1. Therefore, in the case of Example 1, it could be confirmed that the fluorine-based binder resin was not removed during the manufacturing process of the color filter, increased the contact angle of the surface of the color filter film, and hydrophobilized the surface.

Meanwhile, in the case of Comparative Example 1, a water stain may occur according to a state of the surface. Further, the stain due to developing may occur according to the degree of hydrophilicity or hydrophobicity of the surface. Therefore, it could be confirmed that the contact angle of water was low as compared to Example 1.

Further, in the case where the amount of the surfactant was increased like Comparative Example 2 or in the case where the kind of surfactant was changed like Comparative Example 3, it could be confirmed that the contact angle of the surface was slightly improved as compared to Comparative Example 1. However, from the fact that the contact angle of water is significantly low as compared to Example 1, it can be confirmed that since the surfactant is present in a low content in the photosensitive resin composition and can be removed during the manufacturing process of the color filter, in particular, the developing process, there is a limitation in improvement.

Accordingly, in the case of the photosensitive resin composition of Example 1, it can be confirmed that there is an effect of preventing occurrence of a water stain because the contact angle of the coating film can be increased.

It will be apparent to those skilled in the art that various modifications and changes may be made without departing from the scope and spirit of the application.

Therefore, it should be understood that the above embodiment is not limitative, but illustrative in all aspects. The scope of the application is defined by the appended claims rather than by the description preceding them, and therefore all changes and modifications that fall within metes and bounds of the claims, or equivalents of such metes and bounds are therefore intended to be embraced by the claims.

The invention claimed is:

1. A fluorine-based resin represented by the following Formula 14:

[Formula 14]

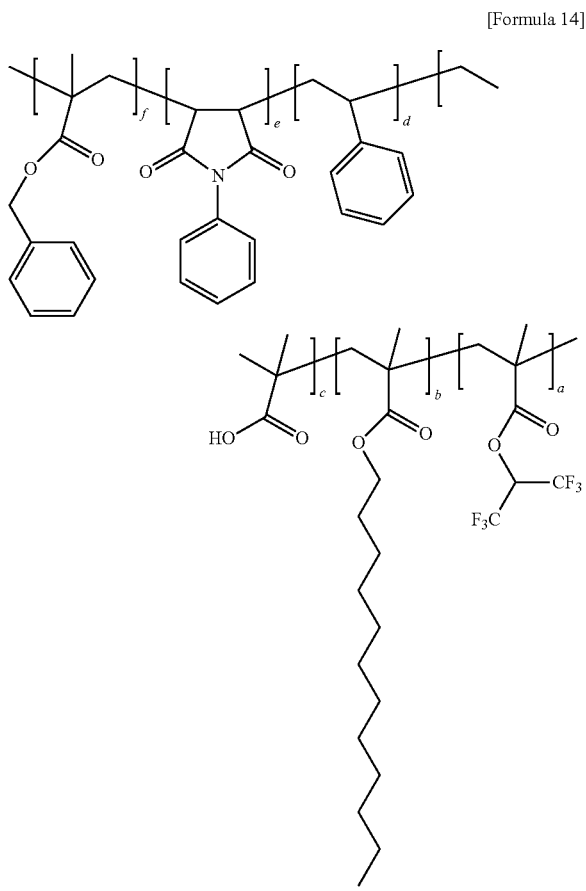

wherein a, b, c, d, e and f are a mole mixing ratio, a is 5 to 30, b is 5 to 30, c is 10 to 60, $0 < d \leq 20$, $0 < e \leq 20$, and $0 < f \leq 70$.

2. The fluorine-based resin of claim 1, wherein an acid value of the fluorine-based resin is 30 to 300 KOH mg/g.

3. The fluorine-based resin of claim 1, wherein a weight average molecular weight of the fluorine-based resin is 5,000 to 30,000.

4. A photosensitive resin composition comprising:
a binder resin including the fluorine-based resin of claim 1,
a polymerizable compound including an ethylenically unsaturated bond,
a photoactive compound, and
a solvent.

5. The photosensitive resin composition of claim 4, wherein a content of the fluorine-based resin is 1 to 20 wt % based on a total weight of the photosensitive resin composition.

6. The photosensitive resin composition of claim 4, wherein a content of the polymerizable compound including the ethylenically unsaturated bond is 1 to 30 wt % based on a total weight of the photosensitive resin composition.

7. The photosensitive resin composition of claim 4, wherein a content of the photoactive compound is 0.1 to 5 wt % based on a total weight of the photosensitive resin composition.

8. The photosensitive resin composition of claim 4, wherein a content of the solvent is 40 to 95 wt % based on a total weight of the photosensitive resin composition.

9. The photosensitive resin composition of claim 4, further comprising:
a surfactant.

10. The photosensitive resin composition of claim 9, wherein the surfactant is included in a content of 0.01 to 5 wt % based on a total weight of the photosensitive resin composition.

11. The photosensitive resin composition of claim 4, further comprising:
one or two or more additives selected from the group consisting of a colorant, a curing accelerator, a thermal polymerization inhibitor, a dispersing agent, an antioxidant, a UV absorbent, a leveling agent, a photosensitizer, a plasticizer, an adhesion promoter, a filler and a surfactant.

12. The photosensitive resin composition of claim 11, wherein the colorant is included in a content of 1 to 20 wt % based on a total weight of the photosensitive resin composition, and the additives other than the colorant are each included in a content of 0.01 to 5 wt % based on the total weight of the photosensitive resin composition.

13. A photosensitive material manufactured by using the photosensitive resin composition of claim 4.

14. The photosensitive material of claim 13, wherein the photosensitive material is selected from the group consisting of a pigment dispersion type photosensitive material for manufacturing a color filter, a photosensitive material for forming a black matrix, a photosensitive material for forming an overcoat layer, a photosensitive material for a column spacer and a photosensitive material for a printed circuit board.

15. A method of manufacturing a photosensitive material, comprising:
applying the photosensitive resin composition of claim 4 on a substrate; and
exposing and developing the applied photosensitive resin composition.

16. An electronic device manufactured by using the photosensitive resin composition of claim 4.

* * * * *